United States Patent
Chen et al.

(10) Patent No.: US 11,604,372 B2
(45) Date of Patent: Mar. 14, 2023

(54) METHOD AND CONTROL DEVICE FOR LAMINATING DISPLAY PANEL AS WELL AS VACUUM LAMINATOR

(71) Applicant: HKC Corporation Limited, Guangdong (CN)

(72) Inventors: Xin Chen, Guangdong (CN); Jia Peng, Guangdong (CN)

(73) Assignee: HKC Corporation Limited, Shenzhen (CN)

( * ) Notice: Subject to any disclaimer, the term of this patent is extended or adjusted under 35 U.S.C. 154(b) by 753 days.

(21) Appl. No.: 16/531,024

(22) Filed: Aug. 3, 2019

(65) Prior Publication Data

US 2020/0159049 A1 May 21, 2020

Related U.S. Application Data

(63) Continuation of application No. PCT/CN2018/122009, filed on Dec. 19, 2018.

(30) Foreign Application Priority Data

Nov. 15, 2018 (CN) .......................... 201811358663.5

(51) Int. Cl.
  *G02F 1/13* (2006.01)
  *G02F 1/1333* (2006.01)
  *H05K 3/00* (2006.01)

(52) U.S. Cl.
  CPC ...... *G02F 1/1303* (2013.01); *G02F 1/133308* (2013.01); *H05K 3/0058* (2013.01); *G02F 1/133317* (2021.01); *H05K 2203/06* (2013.01); *H05K 2203/085* (2013.01)

(58) Field of Classification Search
  CPC ............ G02F 1/1303; G02F 1/133308; G02F 1/133317; H05K 3/0058; H05K 2203/06; H05K 2203/085; B32B 41/00
  See application file for complete search history.

(56) References Cited

U.S. PATENT DOCUMENTS

2003/0178468 A1* 9/2003 Lee ...................... H01L 21/6838
  228/49.5
2003/0226633 A1* 12/2003 Muramoto .............. B32B 37/10
  349/190

(Continued)

FOREIGN PATENT DOCUMENTS

| CN | 1441293 A | 9/2003 |
|----|-----------|--------|
| CN | 1707323 A | 12/2005 |

(Continued)

OTHER PUBLICATIONS

Translation of CN 104102032 A, Boe Technology Group, Oct. 15, 2014 (Year: 2014).*

(Continued)

*Primary Examiner* — George R Koch

(57) ABSTRACT

This application discloses a method for laminating display panel, a control device for laminating display panel, and a vacuum laminator; the method comprising: conducting a vacuumization at the time of a 1st rough alignment for a 1st substrate and a 2nd substrate put into an enclosed cavity; stopping vacuumization at the time of a 2nd rough alignment for the two.

3 Claims, 4 Drawing Sheets

(56) References Cited

U.S. PATENT DOCUMENTS

| | | | |
|---|---|---|---|
| 2004/0095548 A1* | 5/2004 | Lim | G02F 1/1339 349/187 |
| 2005/0013927 A1* | 1/2005 | Yamazaki | H01L 21/0273 257/E21.026 |
| 2008/0053619 A1 | 3/2008 | Nakayama et al. | |
| 2009/0027592 A1* | 1/2009 | Motomatsu | G02F 1/133504 445/25 |
| 2018/0148531 A1* | 5/2018 | Tamatani | G02F 1/13394 |

FOREIGN PATENT DOCUMENTS

| | | | |
|---|---|---|---|
| CN | 1737672 | A | 2/2006 |
| CN | 1796105 | A | 7/2006 |
| CN | 101900912 | A | 12/2010 |
| CN | 104062793 | A | 9/2014 |
| CN | 104102032 | A | 10/2014 |
| CN | 104339813 | A | 2/2015 |
| CN | 204340329 | U | 5/2015 |
| CN | 104808363 | A | 7/2015 |
| CN | 107544165 | A | 1/2018 |
| JP | 2006047575 | A | 2/2006 |

OTHER PUBLICATIONS

International Search Report of PCT Patent Application No. PCT/CN2018/122009 dated Aug. 6, 2019.

* cited by examiner

US 11,604,372 B2

METHOD AND CONTROL DEVICE FOR LAMINATING DISPLAY PANEL AS WELL AS VACUUM LAMINATOR

CROSS-REFERENCE TO RELATED APPLICATIONS

The present disclosure is a Continuation Application of PCT Application with No. PCT/CN2018/122009, filed on Dec. 19, 2018, which claims the priority of Chinese Patent Application with No. 201811358663.5, entitled "METHOD AND CONTROL DEVICE FOR LAMINATING DISPLAY PANEL AS WELL AS VACUUM LAMINATOR", filed on Nov. 15, 2018, which is hereby incorporated by reference in its entirety.

FIELD OF THE DISCLOSURE

This application relates to the field of the manufacture of liquid crystal panel, and particularly, to a method for laminating display panel, a control device for laminating display panel, and a vacuum laminator.

BACKGROUND OF THE DISCLOSURE

Having numerous advantages such as thin body, saving of electricity, no radiation etc., liquid crystal displays have been widely used. Presently, in the process of manufacturing display panels, it is necessary to laminate a 1st substrate and a 2nd substrate under a vacuum environment. However, in the process of laminating the 1st substrate and the 2nd substrate, if under a relatively low atmospheric pressure for a long time, the leakage of light will easily occur on the manufactured display panel, leading to a poor display effect.

SUMMARY OF THE DISCLOSURE

A main object of this application is to provide a method for laminating display panel to reduce the light leakage of display panels.

To achieve the foregoing purpose, this application proposes a method for laminating display panel, comprising the following steps of:

providing a 1st substrate and a 2nd substrate to be laminated and putting them into an enclosed cavity;

conducting a 1st rough alignment for the 1st substrate and the 2nd substrate;

vacuumizing the enclosed cavity by a vacuumizing device;

conducting a 2nd rough alignment for the 1st substrate and the 2nd substrate and stopping the vacuumization of the vacuumizing device;

continuing the vacuumization for the enclosed cavity and conducting a fine alignment for the 1st substrate and the 2nd substrate; and laminating the 1st substrate and the 2nd substrate.

In an embodiment of this application, a calibration camera is disposed to conduct a 1st rough alignment and a 2nd rough alignment; after 'conducting the 2nd rough alignment for the 1st substrate and the 2nd substrate and causing the vacuumizing device to stop vacuumization', it further comprises:

sending, by the rough calibration camera, a control signal for causing the vacuumizing device to continue vacuumization to a controller.

In an embodiment of this application, before conducting the 2nd rough alignment for the 1st substrate and the 2nd substrate and causing the vacuumizing device to stop vacuumization, it further comprises:

sending, by the rough calibration camera, a stop signal for causing the vacuumizing device to stop vacuumization to the controller.

In an embodiment of this application, after conducting the 2nd rough alignment for the 1st substrate and the 2nd substrate and causing the vacuumizing device to stop vacuumization, it further comprises:

setting a preset stop time inside the controller in a manner that the preset stop time roughly matches with the completion time of the 2nd rough alignment; and causing, by the controller, the vacuumization to continue at the time of reaching the preset stop time.

In an embodiment of this application, before conducting the 2nd rough alignment for the 1st substrate and the 2nd substrate and causing the vacuumizing device to stop vacuumization, it further comprises:

monitoring the atmospheric pressure of the enclosed cavity;

issuing a warning when the atmospheric pressure of the enclosed cavity reaches preset atmospheric pressure.

In an embodiment of this application, the range of the preset atmospheric pressure is 1000 pa±50 pa.

In an embodiment of this application, the vacuumizing device comprises a control valve; and the process of causing the vacuumizing device to stop vacuumization comprises:

causing the control valve of the vacuumizing device to be in a half-open state so as to stabilize the atmospheric pressure of the enclosed cavity within the preset range.

In an embodiment of this application, 'before providing the 1st substrate and the 2nd substrate to be laminated and putting them into the enclosed cavity', it further comprises:

applying frame glue onto the 1st substrate and the 2nd substrate and injecting liquid crystal in.

In an embodiment of this application, 'after laminating the 1st substrate and the 2nd substrate', it further comprises:

conducting an illuminating treatment for the 1st substrate and the 2nd substrate; and conducting a vacuum breaking treatment for the enclosed cavity.

In an embodiment of this application, the preset range is 800~1000 pa.

In an embodiment of this application, the 1st substrate is thin film transistor substrate and the 2nd substrate is color substrate.

In an embodiment of this application, an upper chuck plate and a lower chuck plate are disposed in the enclosed cavity, and the details of the step of providing the 1st substrate and the 2nd substrate to be laminated and putting them into the enclosed cavity are:

gripping, by mechanical arm, the 1st substrate and the 2nd substrate and put them into the enclosed cavity respectively so that the upper chuck plate adsorbs the 1st substrate and the lower chuck plate adsorbs the 2nd substrate.

In an embodiment of this application, the adsorption of upper chuck plate for the 1st substrate is any one of vacuum adsorption, magnetic adsorption, adhesive adsorption and electrostatic adsorption.

In an embodiment of this application, the adsorption of lower chuck plate for the 2nd substrate is any one of vacuum adsorption, magnetic adsorption, adhesive adsorption and electrostatic adsorption.

In an embodiment of this application, before providing the 1st substrate and the 2nd substrate to be laminated and putting them into the enclosed cavity, it further comprises:

pre-depositing a mark on the 2nd substrate and the 1st substrate as positioning.

In an embodiment of this application, the step of conducting the 1st rough alignment for the 1st substrate and the 2nd substrate comprises:

collecting, by the rough calibration camera, the mark coordinate of one of the 1st substrate and the 2nd substrate so as to cause the other mark coordinate to tally with it.

This application also proposes a control device for laminating display panel comprising a memory, a processor and a display panel lamination program stored in the memory and driven by the processor; the method for laminating display panel will be realized when the processor executes the program for laminating display panel; the method for laminating display panel comprises the following steps of:

providing a 1st substrate and a 2nd substrate to be laminated and putting them into an enclosed cavity;

conducting a 1st rough alignment for the 1st substrate and the 2nd substrate;

vacuumizing the enclosed cavity by a vacuumizing device;

conducting a 2nd rough alignment for the 1st substrate and the 2nd substrate and stopping the vacuumization of the vacuumizing device;

continuing the vacuumization for the enclosed cavity and conducting a fine alignment for the 1st substrate and the 2nd substrate; and laminating the 1st substrate and the 2nd substrate.

This application also proposes a vacuum laminator comprising a vacuumizing device, an enclosed cavity, and a control device for laminating display panel comprising a memory, a processor and a display panel lamination program stored in the memory and driven by the processor; the method for laminating display panel will be realized when the processor executes the program for laminating display panel; the method for laminating display panel comprises the following steps of:

providing a 1st substrate and a 2nd substrate to be laminated and putting them into an enclosed cavity;

conducting a 1st rough alignment for the 1st substrate and the 2nd substrate;

vacuumizing the enclosed cavity by a vacuumizing device;

conducting a 2nd rough alignment for the 1st substrate and the 2nd substrate and stopping the vacuumization of the vacuumizing device;

continuing the vacuumization for the enclosed cavity and conducting a fine alignment for the 1st substrate and the 2nd substrate; and laminating the 1st substrate and the 2nd substrate.

In an embodiment of this application, the vacuumizing device comprises a control valve, and the process of causing the vacuumizing device to stop vacuumization comprises:

causing the control valve of the vacuumizing device to be in a half-open state so as to stabilize the atmospheric pressure of the enclosed cavity within the preset range.

In an embodiment of this application, the preset range is 800~1000 pa.

In the technical solution of this application, firstly a 1st substrate and a 2nd substrate to be laminated are provided and put into an enclosed cavity; and a 1st rough alignment is conducted for the two to realize the alignment of the 1st substrate and the 2nd substrate on horizontal plane and lay the foundation for the lamination of the two; then the enclosed cavity is vacuumized to provide the environment for the lamination of the 1st substrate and the 2nd substrate; next, a 2nd rough alignment is conducted for the 1st substrate and the 2nd substrate to correct the influence of vacuumization on the alignment of the two, and meanwhile the vacuumizing device is controlled to stop vacuumization in this process so that the atmospheric pressure in the enclosed cavity is kept at a certain value, and thereby the suction force of low atmospheric pressure for the 1st substrate and the 2nd substrate will be eliminated and the peel-off of the inner structure of display panel will be avoided, thus eliminating the light leakage of display panel effectively and improving display effect.

BRIEF DESCRIPTION OF THE DRAWINGS

To explain the technical solution in the embodiment of this application or existing technology more clearly, a brief introduction will be made on the drawings used in the description of embodiment or existing technology; obviously, the accompanying drawings in the descriptions below are merely some embodiments of this application, and ordinary artisans concerned can obtain other drawings on the basis of the structure shown by these drawings without creative efforts.

The object realization, function characteristics and advantages of this application will be further described in reference to embodiments and accompanying drawings.

DETAILED DESCRIPTION OF THE EMBODIMENTS

The technical solutions in the embodiments of the present application will be clearly and completely described hereafter in reference to the drawings in the embodiments of the present application. It is apparent that the described embodiments are merely a part of embodiments rather than all the embodiments of the present application. All the other embodiments obtained by the artisans concerned on the basis of the embodiments in the present application without creative efforts fall within the scope of claims of the present application.

It is to be understood that, all of the directional instructions in the exemplary embodiments of the present disclosure (such as top, down, left, right, front, back) can only be used for explaining relative position relations, moving condition of the elements under a special form (referring to figures), and so on, if the special form changes, the directional instructions changes accordingly.

In this application, unless otherwise stated or defined, the terms 'install', 'interconnect' and 'connect' should be understood from a broad extent. For instance, it may be connected in a fixed, removable or integrated manner; and it may be mechanically or electrically connected; and it may be directly or indirectly (via a media in between) connected; and it may be the inside of two elements in communication with each other or two elements interacting with each other. The ordinary artisans concerned may understand the specific meaning of terms in this application according to specific circumstance.

Besides, the descriptions, such as the "first", the "second" in the present application, are only used for descriptive purpose, and cannot be understood as indicating or suggesting relative importance or impliedly indicating the number of the indicated technical features. Therefore, the character indicated by the "first", the "second" can explicitly or implicitly include at least one feature. Additionally, the technical solution of each embodiment can be combined with each other on the condition that it can be realized by ordinary artisans concerned; if the combination of technical solution contradicts each other or cannot be realized, it should be regarded that the combination of such solution does not exist, nor is it in the protection scope required by the present application.

This application provides a method for laminating display panel.

Figure 1:
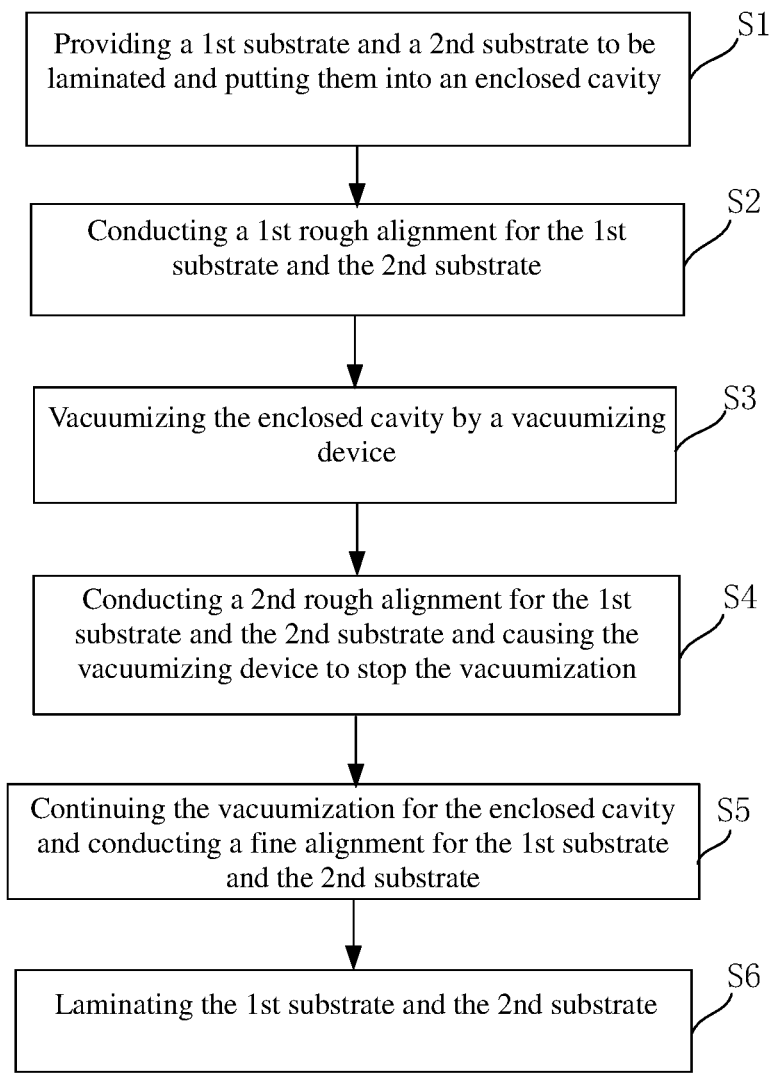
FIG. 1 is a flow diagram of an embodiment of the method for laminating display panel of this application.

With reference to FIG. 1, in an embodiment of this application, the method for laminating display panel comprises the following steps of:

S1: providing a 1st substrate and a 2nd substrate to be laminated and putting them into an enclosed cavity;

S2: conducting a 1st rough alignment for the 1st substrate and the 2nd substrate;

S3: vacuumizing the enclosed cavity by a vacuumizing device;

S4: conducting a 2nd rough alignment for the 1st substrate and the 2nd substrate and causing the vacuumizing device to stop the vacuumization;

S5: continuing the vacuumization for the enclosed cavity and conducting a fine alignment for the 1st substrate and the 2nd substrate;

S6: laminating the 1st substrate and the 2nd substrate.

In this embodiment, the display panel is a liquid crystal display panel comprising a 1st substrate and a 2nd substrate facing each other, and a liquid crystal layer sandwiched between the 1st substrate and a 2nd substrate; the 1st substrate is thin film transistor substrate, i.e., TFT substrate and the 2nd substrate is color substrate (CF, Color Filter); the 2nd substrate and the 1st substrate form an enclosed space via a sealing frame, and the liquid crystal layer is disposed at the enclosed space. The liquid crystal layer of this application may only have liquid crystal molecule, or it may also comprise liquid crystal molecule and phototropic monomer. The 2nd substrate comprises a glass substrate, a light shielding layer, a color blocking layer and a conducting layer. The 1st substrate comprises an underlay substrate, data line, gate line, thin film transistor and pixel electrode; all of the elements are piled up layer by layer on the underlay substrate and the glass substrate via the process of coating, exposing, developing and etching so as to ensure the stability of the structure. The display panel is also provided with a lower polaroid and an upper polaroid at the lower surface of 1st substrate and the upper surface of 2nd substrate in a manner that the polarization direction of the two are perpendicular to each other; the ray of light firstly passes through the lower polaroid and becomes linear polarized light, with its polarization direction tallying with that of the lower polaroid; when passing through the liquid crystal layer and refracted by liquid crystal molecule, the ray of light will turn a polarization direction of 90° by means of the inclination angle of liquid crystal molecule so as to pass through the upper polaroid perpendicular to the lower polaroid and realize display screen.

In step S1, i.e. providing a 1st substrate and a 2nd substrate to be laminated and putting them into an enclosed cavity, the 1st substrate and the 2nd substrate are firstly prepared and then placed at the storing place of vacuum laminator for lamination. Then, before putting the 1st substrate and the 2nd substrate into an enclosed cavity, it further comprises the step S01: applying frame glue onto the 1st substrate and the 2nd substrate and injecting liquid crystal in. Namely, to tightly laminate the 1st substrate and the 2nd substrate into a display panel, sealing glue is applied to form a frame, and liquid crystal is injected into the frame; thus, on one hand, the structure is stable, and on the other hand, it can stop liquid crystal in a certain degree.

Then, mechanical arm is used to respectively grip the 1st substrate and the 2nd substrate and put them into an enclosed cavity; the inside of enclosed container formed with an enclosed cavity is provided with two chuck plates divided into upper chuck plate and lower chuck plate, the material of which may be metal or quartz glass. The upper chuck plate adsorbs the 1st substrate and the lower chuck plate adsorbs the 2nd substrate; the alignment may be conducted by fixing the lower chuck plate while moving the upper chuck plate or fixing the upper chuck plate while moving the lower chuck plate. The adsorption of upper chuck plate and lower chuck plate for 1st substrate and 2nd substrate may be vacuum adsorption, magnetic adsorption, adhesive adsorption, electrostatic adsorption etc. and other method that can fix, depending on the material of upper chuck plate and lower chuck plate.

In step 2, a 1st rough alignment is conducted for the 2nd substrate and the 1st substrate by adopting a rough calibration camera and pre-depositing a mark on the 2nd substrate and the 1st substrate as positioning; the rough calibration camera collects the mark coordinate of one of the 1st substrate and the 2nd substrate so as to cause the other mark coordinate to tally with it, and thereby a rough alignment is completed.

In step 3, a vacuumizing device is used to vacuumize the enclosed cavity; the vacuumizing device comprises a vacuum pump and an air pipe connected with the air suction opening of the vacuum pump and going into the enclosed cavity; the vacuumizing device is also provided with a control valve so as to control vacuumizing process, tighten the lamination between the 1st substrate and the 2nd substrate, and prevent the air from entering and affecting the quality of display panel.

In step 4, a 2nd rough alignment is conducted for the 1st substrate and the 2nd substrate to correct the deviation of 1st substrate and 2nd substrate caused by vacuumization and ensure the smooth progression of next step. Meanwhile, the vacuumizing device will be controlled to stop vacuumization, i.e., the atmospheric pressure in the enclosed cavity will not continue dropping but be kept within a certain pressure range, and thereby the suction force of vacuum pump will not affect the detachment of the frame glue and the liquid crystal around the 2nd substrate and the 1st substrate, thus reducing the light leakage around display panel and improving display effect.

Specifically, the step S4 of 'causing the vacuumizing device to stop the vacuumization' comprises S41: causing the control valve of the vacuumizing device to be in a half-open state so as to stabilize the atmospheric pressure of the enclosed cavity within the preset range. The preset range is 800~1000 pa. When the 2nd rough alignment starts under a certain atmospheric pressure (e.g., 1000 pa), the vacuumizing device will be controlled to keep the atmospheric pressure of enclosed cavity stable instead of letting it continue dropping; however, according to the mechanism of delay control, the actual atmospheric pressure in the enclosed cavity is allowed to drop to the range of 800~1000 pa, and in subsequent steps, the time when the display panel is under low pressure will be shortened, and the possibility of light leakage will be reduced. The control valve of vacuumizing device will be fully opened at the time of vacuumization and the gas inside will be extracted; when the vacuumization needs to be stopped, it is not that the vacuum pump will stop running but that the control valve will be in a half-open state to reduce the rate of extracted gas; meanwhile, the enclosed cavity will be filled with gas to ensure that the atmospheric pressure will be stabilized at the preset threshold value. This method may be realized by manually adjusting the vacuum pump, and it is also possible to conduct adjustment and control by disposing a controller.

In step 5, a fine alignment will be conducted for the 1st substrate and the 2nd substrate while causing the vacuum pump to conduct vacuumization; different from the calibrating precision of rough calibration camera, the fine calibration camera used in this process can align the mark of the 1st substrate with that of the 2nd substrate in a more precise dimension so as to realize the precise alignment of the two. The vacuumization is continued to cause the pressure in the enclosed cavity to continue dropping, thus providing necessary environment for the tightness required by the lamination of the two.

In the last step 6, the 1st substrate and the 2nd substrate will be laminated, and at this time, both lamination degree and misalignment precision have reached a certain tightness, and the pressure of vacuumization has also reached the pressure that satisfy vacuum environment, and keeping the display panel under this pressure for some time will not significantly affect the liquid crystal inside, and the pressure of vacuumization can meet the requirement on the lamination degree of display panel.

Figure 3:
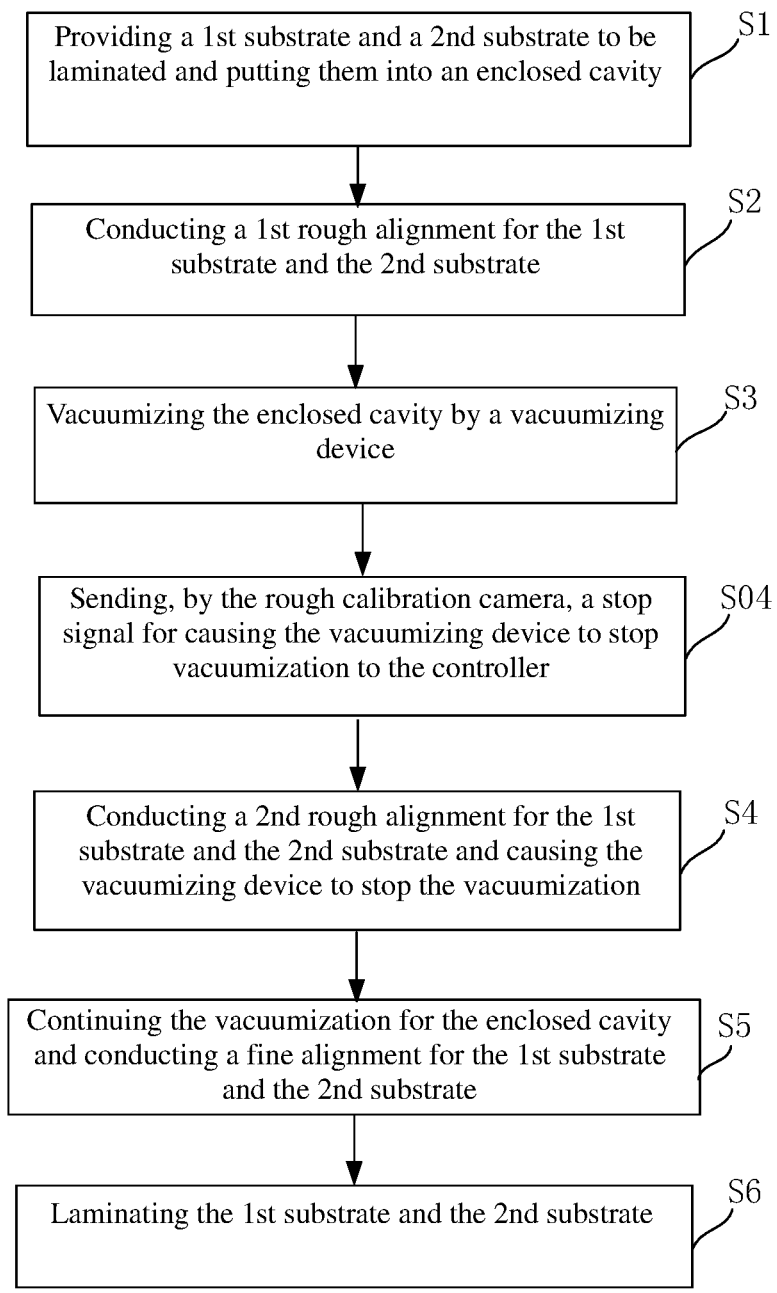
FIG. 3 is a flow diagram of still another embodiment of the method for laminating display panel of this application.

In an embodiment of this application, as shown in FIG. 3, before the 'step 4: conducting a 2nd rough alignment for the 1st substrate and the 2nd substrate and causing the vacuumizing device to stop the vacuumization', it further comprises:

S04: sending, by the rough calibration camera, a stop signal for causing the vacuumizing device to stop vacuumization to the controller.

In this embodiment, it is possible to dispose a controller on the vacuum laminator to conduct logic control for the whole lamination process; the controller may be disposed on the circuit board of the vacuum laminator or separately disposed on the vacuum laminator. The vacuumization will be conducted after the completion of 1st rough alignment, and at the time of 2nd rough alignment, the rough calibration camera can be connected with the controller to issue a stop signal for causing the vacuumizing device to stop vacuumization so that the controller will cause the vacuumizing device to execute. Before the start of 2nd rough alignment, a time may be set for the issuance of the stop signal, and it happens to execute 2nd rough alignment when the controller causes the vacuumizing device to stop, and thereby the influence of excessively-low pressure on the liquid crystal inside display panel will be further reduced, and the leakage of light will be decreased, thus improving the edge display effect of display panel and factory yield.

In an embodiment of this application, after the 'step S4: conducting a 2nd rough alignment for the 1st substrate and the 2nd substrate and causing the vacuumizing device to stop the vacuumization', it further comprises:

S05: sending, by the rough calibration camera, a control signal for causing the vacuumizing device to continue vacuumization to the controller.

In this embodiment, it is necessary to continue the vacuumization after the completion of 2nd rough alignment so as to cause the pressure in the enclosed cavity to continue dropping; thus, at the completion of 2nd rough alignment, the rough calibration camera can issue a control signal so that the controller causes the vacuum pump to continue vacuumization. Undoubtedly, it is also possible to set inside the controller a preset stop time that roughly matches with the completion time of 2nd rough alignment, and thereby the vacuum pump will directly control the control valve to cause the vacuumization to continue.

Figure 4:
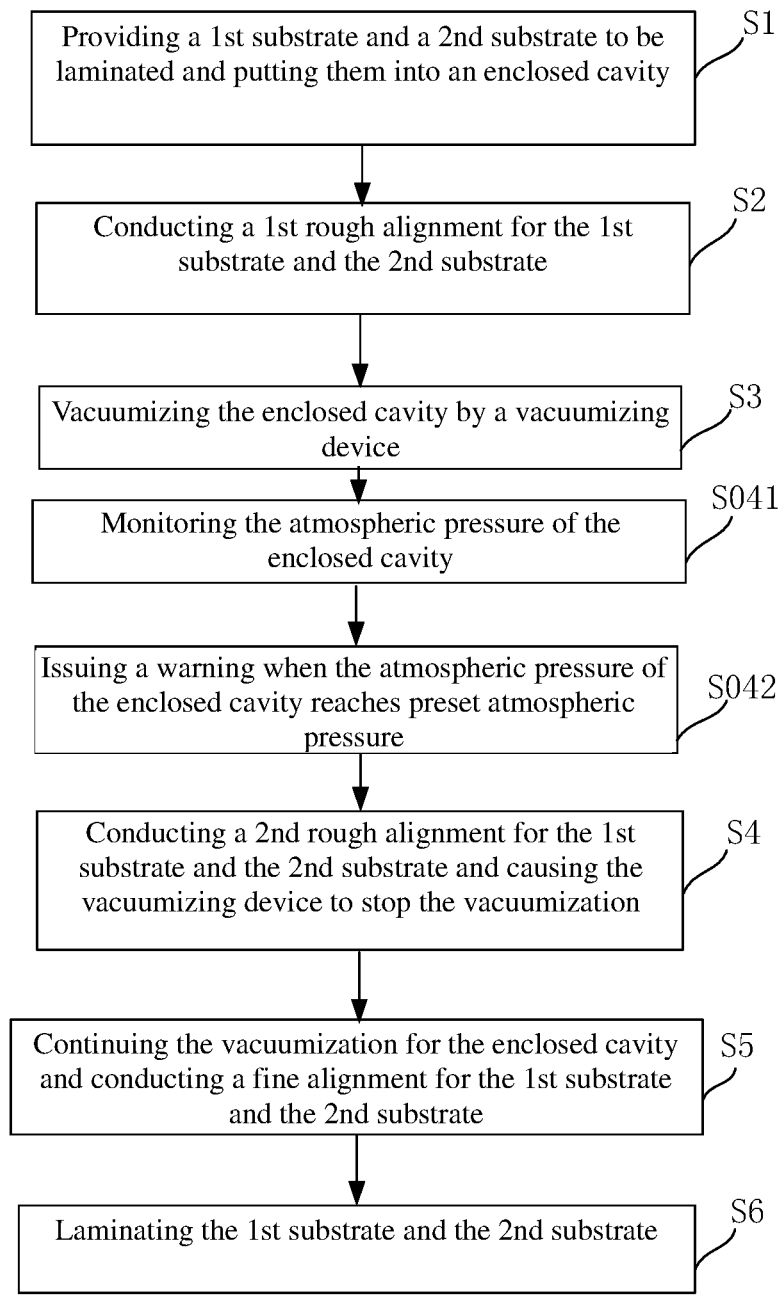
FIG. 4 is a flow diagram of yet still another embodiment of the method for laminating display panel of this application.

In an embodiment of this application, as shown in FIG. 4, before the 'step 4: conducting a 2nd rough alignment for the 1st substrate and the 2nd substrate and causing the vacuumizing device to stop the vacuumization', it further comprises:

S041: monitoring the atmospheric pressure of the enclosed cavity;

S042: issuing a warning when the atmospheric pressure of the enclosed cavity reaches preset atmospheric pressure.

In this embodiment, it is possible to monitor the pressure in the enclosed cavity before conducting the 2nd rough alignment or dispose a monitoring device to monitor the whole process of display panel lamination so that the concrete condition of the display panel under pressure can be easily known and controlled. When the atmospheric pressure in the enclosed cavity reaches the preset value, the detecting device will issue a warning to remind users to conduct the 2nd rough alignment or cause the vacuumizing device to stop vacuumization. This method can effectively and timely conduct control according to pressure, further improving the efficiency of lamination. Specifically, in an embodiment, the preset range of atmospheric pressure is 1000 pa±50 pa. The process of vacuumization is very fast, so in the process of fine alignment that is conducted after 2nd rough alignment, the pressure in the enclosed cavity will be 10 pa or higher under the control of vacuum pump, and will drop to 10 pa or lower or 1 pa or lower after the completion of lamination; the suction force at this time will rapidly increase but will have relatively small influence on liquid crystal.

Figure 2:
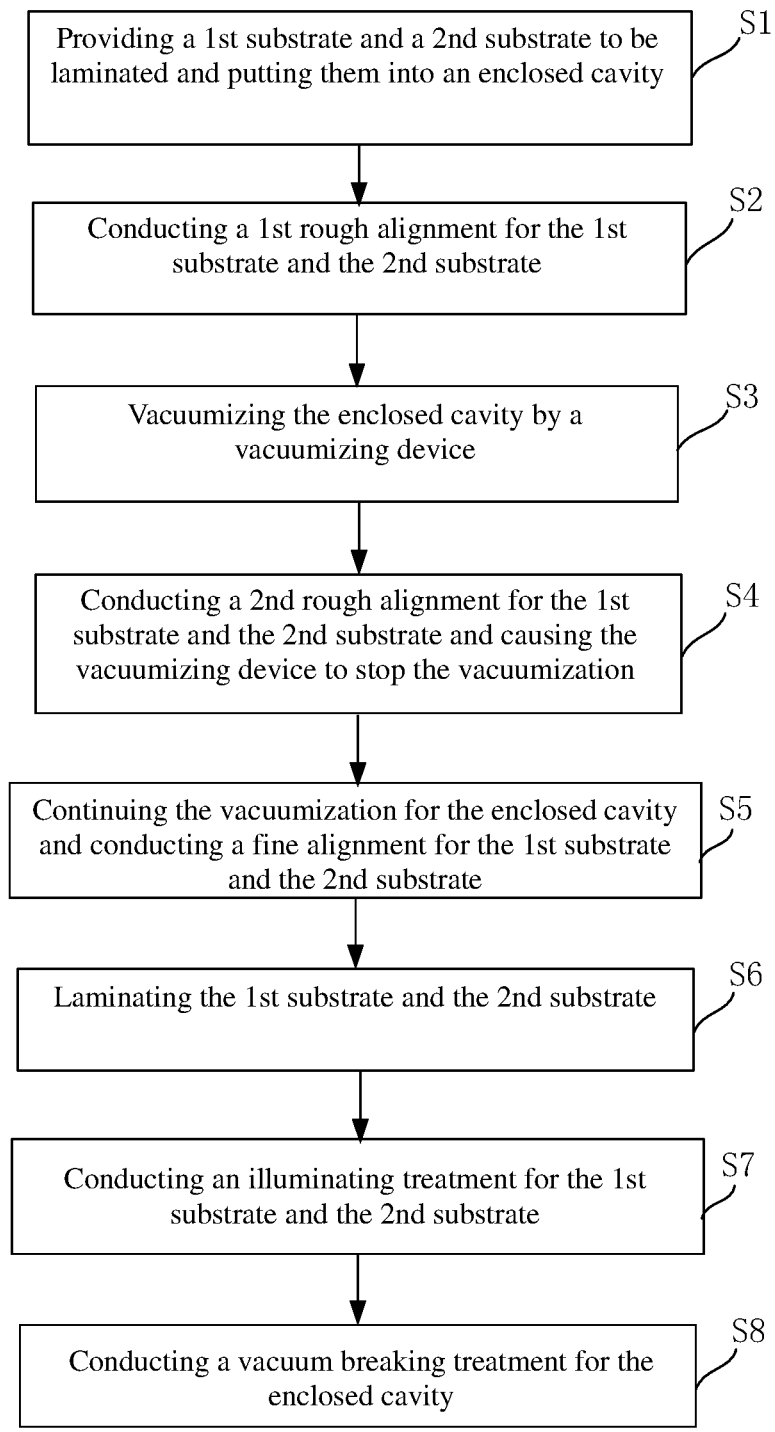
FIG. 2 is a flow diagram of another embodiment of the method for laminating display panel of this application.

Besides, as shown in FIG. 2, after the 'step S6: laminating the 1st substrate and the 2nd substrate', it further comprises:

S7: conducting an illuminating treatment for the 1st substrate and the 2nd substrate;

S8: conducting a vacuum breaking treatment for the enclosed cavity.

In this embodiment, it is necessary to solidify the frame glue between the 1st substrate and the 2nd substrate after the lamination of the two so as to complete fixation effectively and ensure that the liquid crystal is located between the two substrates. Specifically, an ultra violet (UV) light source, a light guide plate and a UV mask plate are adopted. The UV light source is disposed outside an enclosed cavity, and the light guide plate and the UV mask plate are disposed inside a vacuum cavity; the UV light source emits UV light that will go into the light guide plate and convert to surface light source; then it will pass through the UV mask plate and be cast onto the frame glue, inducing the polymerization of frame glue monomer to solidify it and provide an enclosed space for liquid crystal molecule.

It is necessary to take out the display panel from the enclosed cavity after lamination; firstly, the vacuum of the enclosed cavity is to be broken, i.e., a vacuum breaking treatment is to be conducted. A vacuum pump may be used to fill the enclosed cavity with air to break vacuum so that the display panel can slide out from one side of the enclosed container and be conveyed to the place for next step via a conveying mechanism. Undoubtedly, it may also be gripped by mechanical arm again and put at the place for next step. This process is simple and rapid, capable of realizing automation production and greatly improving production efficiency.

The display panel needs to be fitted with backlight assembly after being provided with a drive and a circuit board so as to complete the preparation of display device. The backlight assembly is disposed near the lower polaroid to provide uniform and bright light source for display. The backlight assembly usually comprises a light source, a light guide piece, a reflection piece and an optical film; the reflection piece may be the reflection coating applied onto the surface of the light guide plate. The light guide piece can convert the light source from point light source to uniform surface light source; the disposition of the reflection piece can prevent the ray going into the light guide plate from coming out from one side leaving exit surface and being reflected into the light guide plate, thus preventing the waste of light energy and effectively improving the utilization rate of ray. The backlight assembly provides backlight source to enable display device to obtain better display effect.

This application may also be set as a storage medium stored with a program for display panel lamination; when being executed by processor, the program for display panel lamination will realize the method for laminating display panel. Specifically, the storage medium may include a memory, an operating system, a network communication device, a user interface device and a program for laminating display panel. The network communication device is mainly disposed to connect with a background server and conduct data communication with it; the user interface device is mainly disposed to connect with client side (user side) and conduct data communication with it; the processor may be disposed to call the display panel lamination program stored in the memory and execute the steps of the method.

This application also proposes a control device for laminating display panel comprising a memory, a processor and a display panel lamination program stored in the memory and driven by the processor; the steps of the method for laminating display panel will be realized when the processor executes the program for laminating display panel. As the control device for laminating display panel adopts all the technical solutions of all the embodiments above, so it at least has all the beneficial effects of the technical solution of the embodiments above, and its description will not be repeated here.

This application also proposes a vacuum laminator (not illustrated) comprising a vacuumizing device, an enclosed cavity and the above-mentioned control device for laminating display panel, and the control device of the vacuum laminator can carry out the method for laminating display panel of the embodiment above; as the vacuum laminator adopts all the technical solutions of all the embodiments above, so it at least has all the beneficial effects of the technical solution of the embodiments above, and its description will not be repeated here.

It can be understood by the artisans concerned that the main body in the embodiment of the method for laminating display panel of this application may be vacuum laminator or any other devices that can realize the method for laminating display panel of this application, and vacuum laminator is a preferred main body in the embodiment of the method for laminating display panel of this application; in the embodiment of the control device for laminating display panel of this application, the control device for laminating display panel may be installed in vacuum laminator, or installed in a manner that it is independent of the above-mentioned device and is only in communication connection with vacuum laminator, or installed and used in any other applicable manner.

The description above is only an optional embodiment of this application rather than a limitation on the protection scope of this application, and any equivalent structural changes made in reference to the description and drawings of this application under the concept of this application or its direct/indirect application to other related fields are all included in the protection scope of this application.

The invention claimed is:

1. A method for laminating a display panel, comprising the following steps of:
providing a 1st substrate and a 2nd substrate to be laminated and putting them into an enclosed cavity;
conducting a 1st rough alignment for the 1st substrate and the 2nd substrate;
vacuumizing the enclosed cavity by a vacuumizing device;
sending, by a rough calibration camera, a stop signal for causing the vacuumizing device to stop vacuumization to a controller;
setting a preset stop time inside the controller in a manner that the preset stop time roughly matches with a completion time of a 2nd rough alignment;
causing, by the controller, the vacuumization to continue at the time of reaching the preset stop time;
conducting the 2nd rough alignment for the 1st substrate and the 2nd substrate and stopping the vacuumization of the vacuumizing device, wherein the vacuumizing device comprises a control valve, the control valve for controlling the vacuumizing device is in a half-open state to stabilize an atmospheric pressure of the enclosed cavity within a preset range, the atmospheric pressure in the enclosed cavity stops continuing to drop, and the preset range is 800~1000 pa, the rough calibration camera is disposed to conduct the 1st rough alignment and the 2nd rough alignment;
sending, by the rough calibration camera, a control signal for causing the vacuumizing device to continue vacuumization to the controller;
continuing the vacuumization for the enclosed cavity and conducting a fine alignment for the 1st substrate and the 2nd substrate; and
laminating the 1st substrate and the 2nd substrate.

2. A control device for laminating a display panel comprising a memory, a processor and a display panel lamination program stored in the memory and driven by the processor; a method for laminating the display panel will be realized when the processor executes the program for laminating the display panel; the method for laminating the display panel comprises the following steps of:
providing a 1st substrate and a 2nd substrate to be laminated and putting them into an enclosed cavity;
conducting a 1st rough alignment for the 1st substrate and the 2nd substrate;
vacuumizing the enclosed cavity by a vacuumizing device;
sending, by a rough calibration camera, a stop signal for causing the vacuumizing device to stop vacuumization to a controller;
setting a preset stop time inside the controller in a manner that the preset stop time roughly matches with a completion time of a 2nd rough alignment;
causing, by the controller, the vacuumization to continue at the time of reaching the preset stop time;

conducting the 2nd rough alignment for the 1st substrate and the 2nd substrate and stopping the vacuumization of the vacuumizing device, wherein the vacuumizing device comprises a control valve, the control valve for controlling the vacuumizing device is in a half-open state to stabilize an atmospheric pressure of the enclosed cavity within a preset range, the atmospheric pressure in the enclosed cavity stops continuing to drop, and the preset range is 800~1000 pa, the rough calibration camera is disposed to conduct the 1st rough alignment and the 2nd rough alignment;

sending, by the rough calibration camera, a control signal for causing the vacuumizing device to continue vacuumization to the controller;

continuing the vacuumization for the enclosed cavity and conducting a fine alignment for the 1st substrate and the 2nd substrate; and laminating the 1st substrate and the 2nd substrate.

3. A vacuum laminator comprising a vacuumizing device, an enclosed cavity, and a control device for laminating a display panel comprising a memory, a processor and a display panel lamination program stored in the memory and driven by the processor; a method for laminating the display panel will be realized when the processor executes the program for laminating the display panel; the method for laminating the display panel comprises the following steps of:

providing a 1st substrate and a 2nd substrate to be laminated and putting them into the enclosed cavity;

conducting a 1st rough alignment for the 1st substrate and the 2nd substrate;

vacuumizing the enclosed cavity by the vacuumizing device;

sending, by a rough calibration camera, a stop signal for causing the vacuumizing device to stop vacuumization to a controller;

setting a preset stop time inside the controller in a manner that the preset stop time roughly matches with a completion time of a 2nd rough alignment;

causing, by the controller, the vacuumization to continue at the time of reaching the preset stop time;

conducting the 2nd rough alignment for the 1st substrate and the 2nd substrate and stopping the vacuumization of the vacuumizing device, wherein the vacuumizing device comprises a control valve, the control valve for controlling the vacuumizing device is in a half-open state to stabilize an atmospheric pressure of the enclosed cavity within a preset range, the atmospheric pressure in the enclosed cavity stops continuing to drop, and the preset range is 800~1000 pa, the rough calibration camera is disposed to conduct the 1st rough alignment and the 2nd rough alignment;

sending, by the rough calibration camera, a control signal for causing the vacuumizing device to continue vacuumization to the controller;

continuing the vacuumization for the enclosed cavity and conducting a fine alignment for the 1st substrate and the 2nd substrate; and laminating the 1st substrate and the 2nd substrate.

* * * * *